United States Patent
Ware et al.

(10) Patent No.: US 10,509,448 B2
(45) Date of Patent: Dec. 17, 2019

(54) THERMAL CLAMP FOR CYROGENIC DIGITAL SYSTEMS

(71) Applicant: RAMBUS INC., Sunnyvale, CA (US)

(72) Inventors: Frederick A. Ware, Los Altos Hills, CA (US); John Eric Linstadt, Palo Alto, CA (US); Patrick R. Gill, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 370 days.

(21) Appl. No.: 15/243,596

(22) Filed: Aug. 22, 2016

(65) Prior Publication Data
US 2017/0090533 A1 Mar. 30, 2017

Related U.S. Application Data

(60) Provisional application No. 62/232,260, filed on Sep. 24, 2015.

(51) Int. Cl.
*G06F 1/20* (2006.01)
*F25B 49/00* (2006.01)
(Continued)

(52) U.S. Cl.
CPC .............. *G06F 1/206* (2013.01); *F25B 49/00* (2013.01); *G06F 1/26* (2013.01); *H05K 7/20372* (2013.01);
(Continued)

(58) Field of Classification Search
CPC ... G06F 1/20; G06F 1/206; G06F 1/26; H01L 39/10; H01L 39/02; H05K 7/20372; H05K 7/2039; H05K 7/205; H01R 4/68
See application file for complete search history.

(56) References Cited

U.S. PATENT DOCUMENTS 3,522,361 A * 7/1970 Kafka ................... H01F 6/065
174/125.1
4,992,262 A 2/1991 Briley et al.
(Continued)

FOREIGN PATENT DOCUMENTS

WO WO 96/24939 A1 8/1996

OTHER PUBLICATIONS

Delmas, J. et al., "Application of New Figures of Merit for Multi-Stage Cryocoolers", Cryocoolers 16, International Cryocooler Conference, Inc., Boulder, CO, 2011, pp. 645-653. 9 pages.
(Continued)

*Primary Examiner* — Steven T Sawyer
*Assistant Examiner* — Paresh H Paghadal
(74) *Attorney, Agent, or Firm* — Lowenstein Sandler LLP (57) ABSTRACT

The embodiments herein describe technologies of cryogenic digital systems with a power supply located in an ambient temperature domain and logic located in a cryogenic temperature domain. A pair of conductors is operable to carry current with a voltage difference between the power supply and the logic. The pair of conductors includes a first portion thermally coupled to a temperature-regulated or temperature-controlled intermediate temperature domain. The intermediate temperature domain is less than the ambient temperature domain and greater than the cryogenic temperature domain.

18 Claims, 10 Drawing Sheets

(51) Int. Cl.
*G06F 1/26* (2006.01)
*H05K 7/20* (2006.01)
H01B 12/02 (2006.01)
H01R 4/68 (2006.01)
H01L 39/02 (2006.01)
H02G 15/34 (2006.01)

(52) U.S. Cl.
CPC .............. *H01B 12/02* (2013.01); *H01L 39/02* (2013.01); *H01R 4/68* (2013.01); *H02G 15/34* (2013.01); *H05K 7/205* (2013.01); *H05K 7/2039* (2013.01)

(56) References Cited

U.S. PATENT DOCUMENTS

| | | | |
|---|---|---|---|
| 5,612,615 A | 3/1997 | Gold et al. | |
| 5,977,479 A * | 11/1999 | Tokuda | H01L 23/34 165/185 |
| 5,991,647 A | 11/1999 | Brockenborough et al. | |
| 6,173,577 B1 | 1/2001 | Gold | |
| 6,403,887 B1 * | 6/2002 | Kebabjian | H01B 11/002 174/110 R |
| 6,545,880 B1 | 4/2003 | Mueller | |
| 7,263,841 B1 | 9/2007 | Arman et al. | |
| 8,316,651 B2 | 11/2012 | Schlenga et al. | |
| 8,373,066 B2 | 2/2013 | Lallouet et al. | |
| 9,552,906 B1 * | 1/2017 | Mine | G01R 15/202 |
| 2003/0154727 A1 * | 8/2003 | Ashibe | H02G 15/34 62/45.1 |
| 2006/0260837 A1 * | 11/2006 | Manousiouthakis | H01B 12/16 174/125.1 |
| 2007/0028636 A1 | 2/2007 | Royal et al. | |
| 2008/0115510 A1 | 5/2008 | Crowley et al. | |
| 2009/0166084 A1 | 7/2009 | Mirebeau et al. | |
| 2009/0192042 A1 * | 7/2009 | Kim | H01B 12/16 505/230 |
| 2010/0084153 A1 * | 4/2010 | Lallouet | H02G 15/34 174/24 |
| 2012/0186854 A1 * | 7/2012 | Choi | H01R 4/68 174/22 R |
| 2013/0263606 A1 * | 10/2013 | Yamaguchi | H02G 15/34 62/3.2 |
| 2014/0011684 A1 * | 1/2014 | Jetter | H01B 12/16 505/163 |
| 2014/0221213 A1 * | 8/2014 | Fukuda | H01B 12/16 505/163 |
| 2018/0166188 A1 * | 6/2018 | Arndt | H01B 12/16 |

OTHER PUBLICATIONS

Kadin, Alan M. et al., "Current Leads and Optimized Thermal Packaging for Superconducting Systems on Multistage Cryocoolers", IEEE Transactions on Applied Superconductivity, vol. 17, No. 2, Jun. 2007, pp. 975-978. 4 pages.

* cited by examiner

THERMAL CLAMP FOR CYROGENIC DIGITAL SYSTEMS

RELATED APPLICATION

This application claims the benefit of U.S. Provisional Application No. 62/232,260, filed on Sep. 24, 2015, the entire contents of which are hereby incorporated by reference.

BACKGROUND

Cryogenic digital systems can be used in electronic systems that require voltage and current to be transferred from one temperature domain to a lower temperature domain. For example, the electronic system may include a first temperature domain at 300 Kelvin (K) and a second temperature domain at 4 K. There are other temperature domains that may be used as the second temperature domain, such as 17 K. Copper conductors are used to transfer the voltage and current between components in the temperature domains. The voltage and current on the copper conductors contribute heat into the low temperature domain using two mechanisms: a first mechanism is thermal conduction and the other mechanism is electrical heating. For example, the electronic system with a first temperature domain at 300 K and a second temperature domain at 4 K has a temperature difference ($\Delta T$) of 296 K and the following parameters: a supply current ($I_0$) of 1 amp supplied by a power supply over an electrical conductor pair (wire pair) with a wire length (L) of $10.0 \times 10^{-2}$ M, with a cross-sectional area ($A_0$) of 40 gauge wire ($5.0 \times 10^{-9}$ M$^2$), copper resistivity ($\rho_0$) of $1.55 \times 10^{-8}$ $\Omega$-M, and copper thermal conductivity ($\lambda_0$) of 401 W/M-K. The logic in the second temperature domain uses 1 W of power ($P_L$). The heat power equation for this electronic system is expressed as follows:

$$P_{TOT} = P_L + P_R + P_T = P_L + (2*I_0^2*\rho_0)*L/A_0 + (2*\lambda_0*\Delta T)*A_0/L$$

The cross-sectional area over the length is an aspect ratio and the length over the cross-sectional area is the inverse aspect ratio. The copper conductors are insulated on sidewalls. The $P_T$ represents the thermal conduction power and $P_R$ represents the electrical resistance power. In this example, the total power (heat) flow is 1.63 Watts (W) with 63% overhead due to $P_R$ and $P_T$.

Heat flow to the second temperature domain in a cryogenic digital system is a concern. There is a huge efficiency factor that has to be applied to calculate the amount of energy at room temperature to pull the heat out at a low-temperature domain, as illustrated in FIG. 1.

Figure 1:
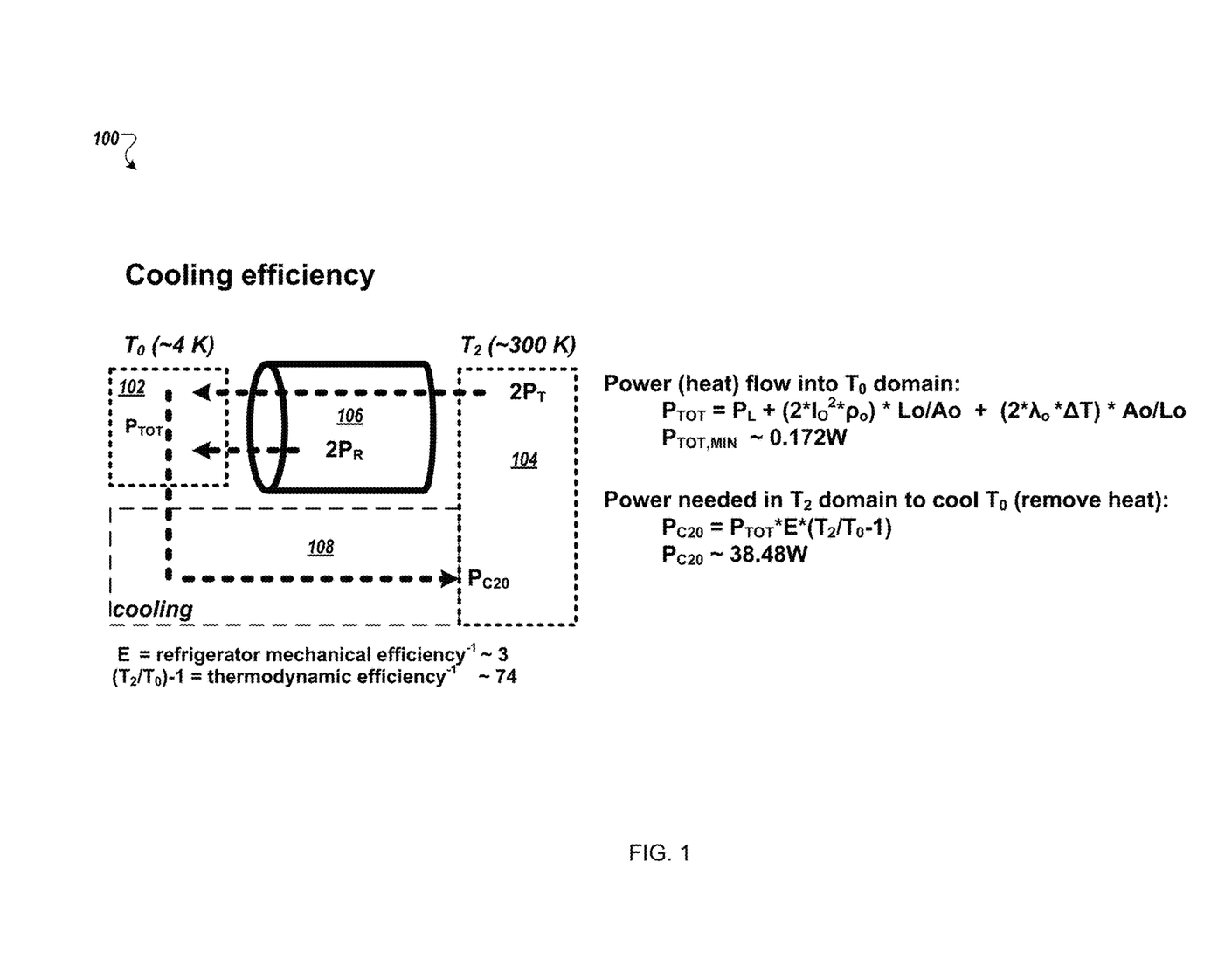
FIG. 1 is a block diagram illustrating a cooling efficiency for removing power (heat) from a low-temperature domain in a cryogenic digital system.

FIG. 1 is a block diagram illustrating a cooling efficiency for removing power (heat) from a low-temperature domain in a cryogenic digital system 100. The cryogenic digital system 100 includes a room-temperature domain 104 ($T_2$) and a low-temperature domain 102 ($T_0$). A power supply in the room-temperature domain 104 provides power through an electrical conductor pair 106, which causes heat transfer to the low-temperature domain via thermal conduction and electrical heating. A cooling subsystem 108 is used to pull heat from the low-temperature domain. The cooling subsystem 108 has an E factor that represents the mechanical efficiency to operate the cooling subsystem (e.g., 3) and a thermodynamic efficiency (e.g., 74). The power (heat) flow into the low-temperature domain is expressed in the equation above. Using the various parameters noted above, the power (heat) flow is 1.63 W (63% overhead). The power needed in room-temperature domain 104 ($T_2$) to remove the logic power, the thermal conduction power and the electrical resistance power is expressed in the following equation:

$$P_{C20} = P_{TOT}*E*(T_2/T_0-1),$$

where E is the inverse refrigerator mechanical efficiency (the inverse noted by efficiency$^{-1}$) and ($T_2/T_0-1$) is the thermodynamic efficiency$^{-1}$. With the values for the parameters above, the power needed ($P_{C20}$) is 362 W, with 140 W due to overhead.

Optimizing heating in these cryogenic digital systems has not been a priority and thus, there have not been heating optimizations for these cryogenic digital systems.

BRIEF DESCRIPTION OF THE DRAWINGS

The present disclosure is illustrated by way of example, and not by way of limitation, in the figures of the accompanying drawings.

DETAILED DESCRIPTION

The embodiments herein describe technologies of cryogenic digital systems with a power supply located in an ambient temperature domain and logic located in a cryogenic temperature domain. A pair of conductors is operable to carry current with a voltage difference between the power supply and the logic (e.g., an electronic system that operates in the cryogenic domain). The pair of conductors includes a first portion thermally coupled to a temperature-regulated or temperature-controlled intermediate temperature domain. The intermediate temperature domain is less than the ambient temperature domain and greater than the cryogenic temperature domain.

One cryogenic digital system, as described herein, introduces an intermediate temperature domain between a first temperature domain and a second temperature domain, where the second temperature domain is a cryogenic temperature. In one embodiment, a thermal clamp thermally couples the electrical conductor pair to the intermediate temperature domain. For example, the electronic system may have a first temperature domain at room temperature (e.g., 300 K) and a second temperature domain at a cryogenic temperature (e.g., 4 K) and the thermal clamp creates an intermediate temperature domain (e.g., 25 K) between the first temperature domain and the second temperature domain. The thermal clamp may be made of two segments of the electrical conductor pair with a gap in an insulator that insulates the sidewalls of the two segments of the electrical conductor pair. The conductors may be copper and the insulator can have a gap to thermally clamp the conductors to the intermediate temperature domain ($T_1$). The thermal clamp can be designed to optimize the aspect ratios of two segments of the electrical conductor pair, instead of just one segment. The aspect ratio is the cross-sectional area of the wire over the length of the wire. The inverse aspect ratio is the length over the cross-sectional area of the wire. Each of the two segments of wires can have their own aspect ratio. These aspect ratios may be similar or dissimilar. By selecting the appropriate aspect ratios of the two segments of wires, the appropriate intermediate temperature domain can be set to a desired intermediate temperature to operate as a thermal clamp between the two temperature domains. In an embodiment, the thermal clamp is used to extract as much heat as possible at the intermediate temperature domain so that the efficiency overhead to extract the heat from the second (low) temperature domain is going to be smaller than the efficiency overhead to extract the heat at the second temperature without the thermal clamp. The sum of the power needed to extract the heat from the second temperature domain and the power needed to extract the heat from the intermediate temperature domain (at room temperature) is less than the power needed to extract heat from the second temperature domain when not using the thermal clamp with the intermediate temperature domain. These two aspect ratios can be optimized as described herein. It should be noted that "overhead" power of the conductors coupled between a component at the cryogenic temperature domain and another component at the ambient temperature domain is caused by thermal conductivity and electrical resistance. Load power (also referred to as logic power) is intrinsic and is defined by the operational characteristics of the electronic system. As described in the embodiments herein, the "overhead" power is minimized.

In one embodiment, an electronic system operated with a first temperature domain (ambient temperature) and a second temperature domain (cryogenic temperature) includes an electrical conductor pair that carries current with a voltage difference and couples components in the first temperature domain and the second temperature domain. For example, a first component may be a power supply in the ambient temperature domain and the second component can be logic circuitry (load circuit) powered by the power supply, the logic circuitry being located in the cryogenic temperature domain. An intermediate segment of the electrical conductor pair is thermally coupled to an intermediate temperature domain. The intermediate temperature domain may be a temperature-regulated domain or a temperature-controlled domain. In a further embodiment, at least two intermediate segments of each of the electrical conductors of the electrical conductor pair are thermally coupled to at least two intermediate temperature domains. In some embodiments, the first temperature is an ambient temperature domain and the second temperature is a cryogenic domain. It should be noted that the ambient temperature may be ideally room temperature, but can also be influenced by other factors, such as the sub-system environment in which the sub-system is located. For example, the ambient temperature can be the temperature measured in a power supply system located in the ambient temperature domain. It should also be noted that cryogenic temperature domain may be temperatures that start at or below 123 K. A first cooling subsystem can be used to remove heat from the second temperature domain to the first temperature domain. In another embodiment, a first cooling subsystem can remove heat from the second temperature domain to the first temperature domain and a second cooling subsystem can remove heat from the intermediate temperature domain to the first temperature domain. The second cooling subsystem can remove heat from the sidewalls of the electrical conductors. In another embodiment, the second cooling subsystem is adjusted so that a second cooling fluid entering is at a first temperature (entry temperature) and cooling fluid exiting is at a second temperature (exit temperature). In another embodiment, the entry temperature and exit temperature of a second cooling fluid is greater than a first cooling fluid.

Also described herein are technologies for optimizing thermal and resistive heating of a second temperature domain of a cryogenic digital system. The thermal and resistive heating can be optimized by adjusting an aspect ratio of conductors to a single value (e.g., $A_O/L_O$). Alternatively, the aspect ratio of conductors to a set of tapered values (e.g., $A(i)/L(i)$, where $A(i)/L(i)$ are functions of a temperature difference between the first temperature domain and the second temperature domain.

Figure 2:
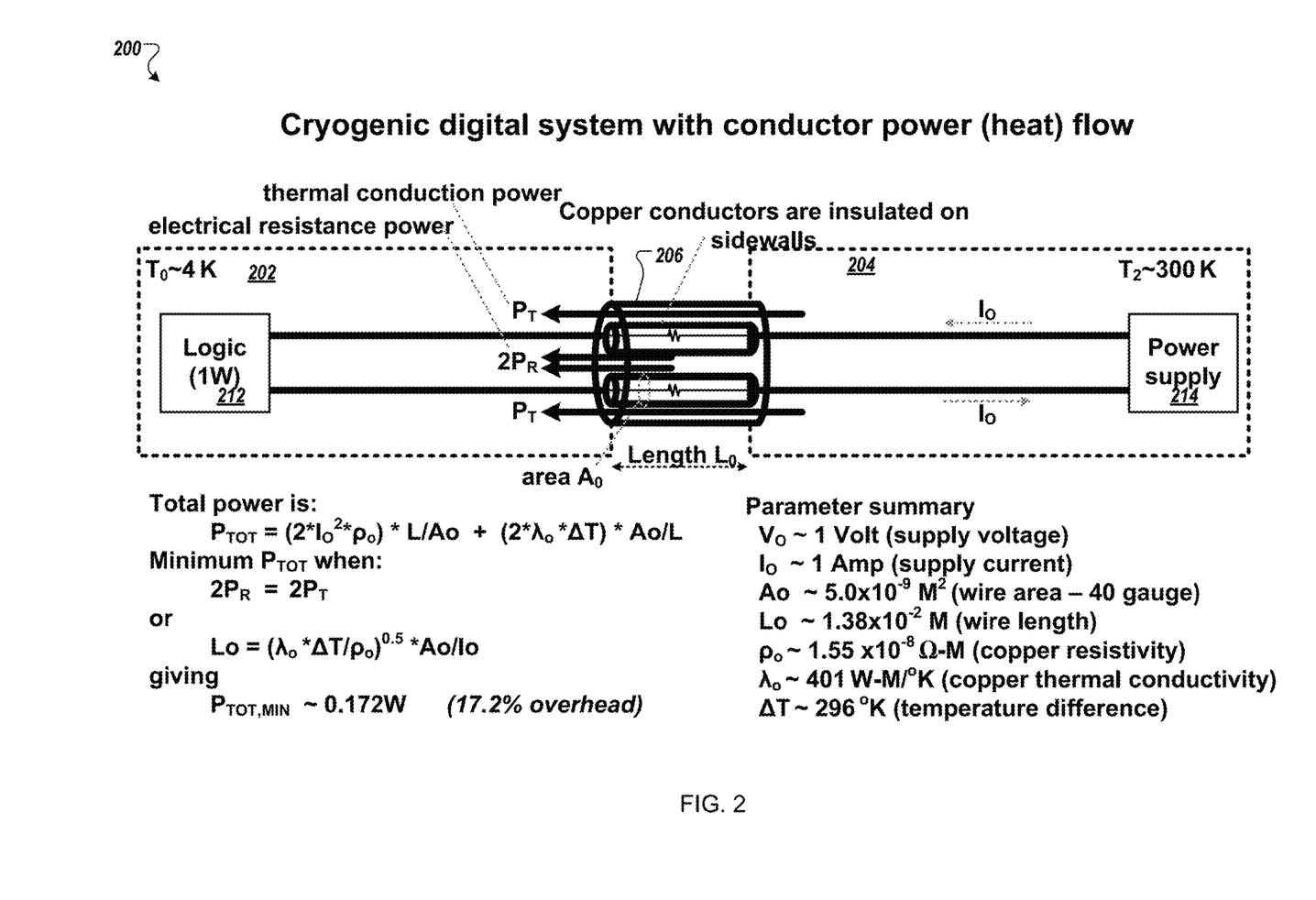
FIG. 2 is a block diagram of a cryogenic digital system with a heating optimization according to one embodiment.

FIG. 2 is a block diagram of a cryogenic digital system 200 with a heating optimization according to one embodiment. The cryogenic digital system 200 includes an ambient (room-temperature) domain 204 ($T_2$) and a low-temperature domain 202 ($T_0$). A power supply 214 in the ambient domain 204 provides power to logic 212 through an electrical conductor pair 206, which causes heat transfer to the low-temperature domain via thermal conduction and electrical heating. Logic 212 may be an electronic system that operates in the cryogenic domain. The logic 212 may include any type of electronic component or integrated circuit device or devices. As referred to herein, logic is intended to include or be representative of any type of integrated circuit component including, for example and without limitation, integrated circuit devices or buffer/bridge devices having high speed serial links, chips such as processors, system on chip (SOC), field programmable gate arrays (FPGA), application specific integrated circuits (ASIC), integrated-circuit memory devices of various types (e.g., dynamic random access memory (DRAM), static random access memory (SRAM), and any of the numerous types of non-volatile memory, including Flash memory, phase-change memory, magneto-resistive memory, etc.), integrated-circuits having a memory control function (e.g., dedicated memory controllers, processors, chipset components, etc.) or any other type of integrated circuit device.

Figure 3:
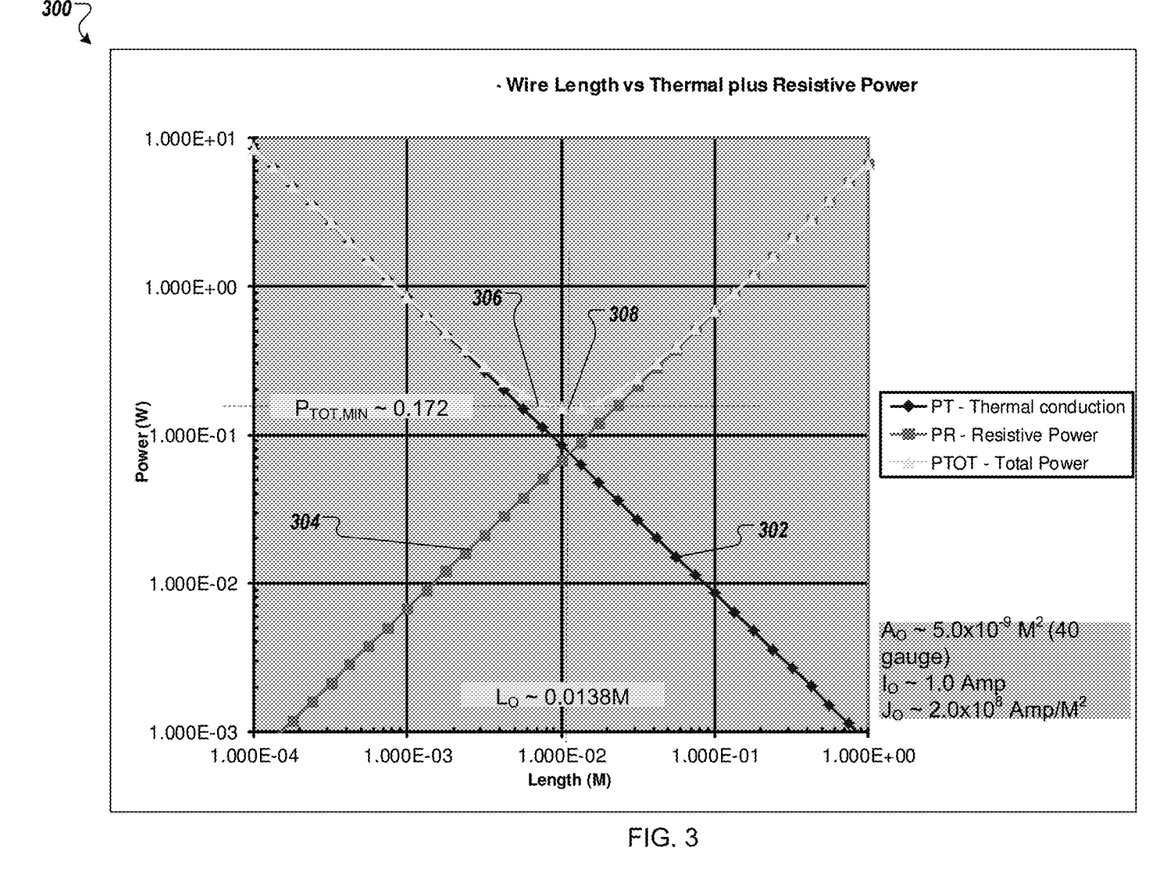
FIG. 3 is a graph of an aspect ratio and inverse aspect ratio of cross-sectional area and length of an electrical conductor pair to transfer current between a first temperature domain and a second temperature domain according to one embodiment.

The conductors of the electrical conductor pair are insulated on sidewalls of the conductors. Unlike the cryogenic digital system 100, the cryogenic digital system 200 has heat optimizations, including setting a length ($L_O$) of the electrical conductor pair to minimize a total thermal power of conductors. FIG. 3 is a graph of the power as a function of an aspect ratio and inverse aspect ratio of cross-sectional area and length of an electrical conductor pair to transfer current between a first temperature domain and a second temperature domain according to one embodiment. As described herein, an aspect ratio (A/L) is the cross-sectional area of the electrical conductor pair over the length of the electrical conductor pair. The inverse aspect ratio is the length over the cross-sectional area (L/A).

Referring back to FIG. 2, in one implementation, the ambient temperature domain is at 300 K and the low-temperature temperature domain is at 4 K, resulting in a temperature difference (ΔT) of 296 K. Assuming the following parameters, the cryogenic digital system 200 with the heat optimizations of the aspect ratio, the heat power can be reduced: a supply current ($I_0$) of 1 amp supplied by a power supply over an electrical conductor pair (wire pair) with an optimized wire length ($L_0$) of $1.38 \times 10^{-2}$ M, with a cross-sectional area ($A_0$) of 40 gauge wire ($5.0 \times 10^{-9}$ M$^2$), copper resistivity ($\rho_0$) of $1.55 \times 10^{-8}$ Ω–M, and copper thermal conductivity ($\lambda_0$) of 401 W/M–K. The logic in the second temperature domain uses 1 W of power. The overhead heat power equation for this electronic system is expressed as follows:

$$P_{OH} = P_T + P_R = (2 * I_0^2 * \rho_0) * L/A_0 + (2 * \lambda_0 * \Delta T) * A_0/L$$

There is a minimum heat power when the thermal conduction power is equal to the electrical resistance power, as expressed in the following two equations:

$$P_T = P_R,$$

where $P_T$ represents the thermal conduction power and $P_R$ represents the electrical resistance power;

$$L_0 = (\lambda_0 * \Delta T/\rho_0)^{0.5} * A_0/I_0$$

In this implementation with the optimized length, the heat power is 0.172 W (17.2% overhead), as compared to the 0.63 W (63% overhead) for the system without heat optimizations described above.

A cooling subsystem (not illustrated in FIG. 2) can be used to pull heat from the low-temperature domain 202. The cooling subsystem has an E factor that represents the mechanical efficiency to operate the cooling subsystem (e.g., 3) and a thermodynamic efficiency (e.g., 74). The power (heat) flow into the low-temperature domain is expressed in the equation above. Using the various parameters noted above, the load power (heat) flow is 1 W. The power needed in room-temperature domain 204 ($T_2$) is expressed in the following equation:

$$P_{C2O} = (P_L + P_{OH,MIN}) * E * (T_2/T_0 - 1),$$

where E is the refrigerator mechanical efficiency$^{-1}$ and ($T_2/T_0 - 1$) is the thermodynamic efficiency$^{-1}$. With the values for the parameters above, the power needed ($P_{C2O}$) in the optimized cryogenic digital system 200 is 260 W, as compared to 362 W for the cryogenic digital system 100 without optimizations.

Referring back to FIG. 3, the graph 300 charts the thermal conduction power 302 as a function of length (for a fixed cross sectional area $A_0$) and resistive power 304 as a function of the length (for a fixed current density $J_0$). The graph 300 also charts the total overhead power (heat) 306. For this optimization, the cross-sectional area ($A_0$) is fixed at $5.0 \times 10^{-9}$ M$^2$ for a 40 gauge wire, the current ($I_0$) is fixed at 1.0 amp, and the current density ($J_0$) is fixed at $2.0 \times 10^8$ amp/M$^2$. As illustrated in FIG. 3, an optimal length ($L_0$) can be determined to determine an optimal, minimum power ($P_{TOT,MIN}$) 308. For this implementation, the minimum power 308 is 0.172 W when the optimal length is 0.0138 M ($1.38 \times 10^{-2}$ M). The wire length can be optimized for the total thermal power of the conductors (thermal conduction plus resistive power) provided to the low-temperature domain. Alternatively, the cross-sectional area could also be adjusted to set the aspect ratio to optimize the heat power (i.e., minimize a total thermal power of conductors).

Figure 4:
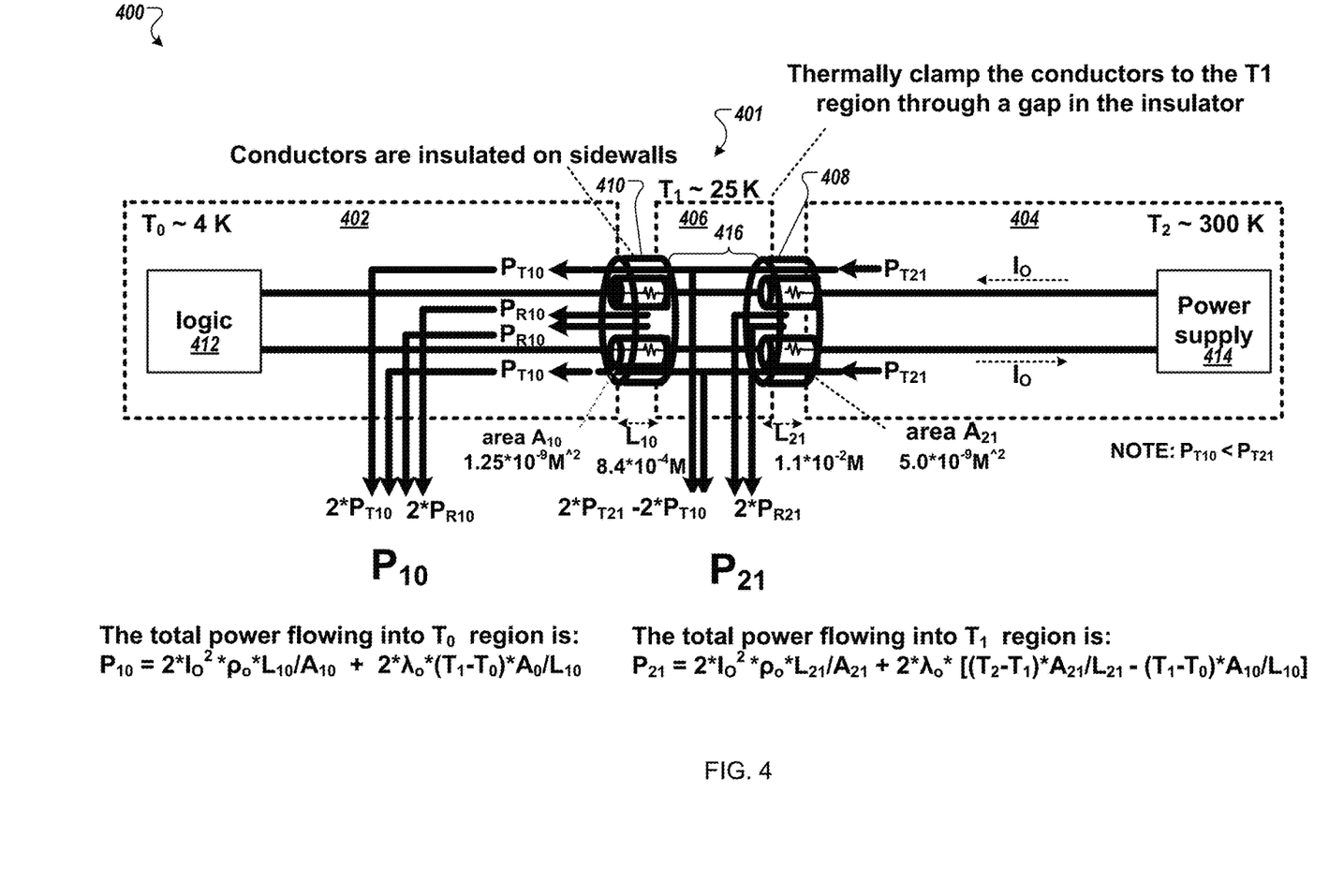
FIG. 4 is a block diagram of a cryogenic digital system with a thermal clamp according to one embodiment.

FIG. 4 is a block diagram of a cryogenic digital system 400 with a thermal clamp 401 according to one embodiment. The cryogenic digital system 400 includes an ambient (room-temperature) domain 404 ($T_2$), a low-temperature domain 402 ($T_0$), and an intermediate temperature domain 406 ($T_1$). In this implementation, the ambient temperature domain 404 is at 300 K, the low-temperature domain 402 is at 4 K, and the intermediate temperature domain 406 is at 25 K. Alternatively, other temperatures may be used for the three temperature domains.

A power supply 414 in the ambient temperature domain 404 provides power to logic 412 through an electrical conductor pair, which causes heat transfer to the low-temperature domain via thermal conduction and electrical heating. The electrical conductor pair is operable to carry current with a voltage difference between the power supply 414 and the logic 412. The electrical conductor pair could be between any component in the ambient temperature domain 404 and the low-temperature domain 402. An intermediate segment of the electrical conductor pair, also referred to herein as thermal clamp 401, is thermally coupled to the intermediate temperature domain 406 that is lower in temperature than the ambient temperature domain 404 and greater in temperature than the low-temperature domain 402. The intermediate temperature domain 406 may be a temperature-regulated domain or a temperature-controlled domain.

As illustrated in FIG. 4, each conductor of the electrical conductor pair is insulated on sidewalls of a first segment 408 of the electrical conductor pair between the ambient temperature domain 404 and the intermediate temperature domain 406 and sidewalls of a second segment 410 of the electrical conductor pair between the intermediate temperature domain 406 and the low-temperature domain 402. The ambient temperature domain 404 may be any ambient temperature and the low-temperature domain may be any cryogenic temperature, such as 123 K and below. The intermediate temperature domain 406 may be other cryogenic temperatures that are greater than the low-temperature domain 402; for example, the intermediate temperature domain 406 may be 25 K and the low-temperature domain 402 may be 4 K. This temperature may also be adjusted based on the heat optimizations described herein, for example, by adjusting aspect ratios of segments (408, 410) of the electrical conductor pair, or even at additional intermediate segments as described herein.

Although not illustrated in FIG. 4, a cooling subsystem can be used to remove heat from the low-temperature domain 402 to the ambient temperature domain 404. In another embodiment, a first cooling subsystem can be used to remove heat from the low-temperature domain 402 to the ambient temperature domain 404 and a second cooling subsystem can be used to remove heat from the intermediate temperature domain 406 to the ambient temperature domain 404.

As described in various embodiments below, additional intermediate segments of the electrical conductor pair can be thermally coupled to one or more additional intermediate temperature domains. In one implementation, a second intermediate segment of the electrical conductor pair is thermally coupled to a second intermediate temperature domain. In another implementation, at least two intermediate segments of the electrical conductor pair are thermally coupled to at least two intermediate temperature domains.

In one embodiment, the intermediate temperature domain 406 is introduced by the thermal clamp 401. For example, the electronic system may have a first temperature domain at room temperature (e.g., 300 K) and a second temperature domain at a cryogenic temperature (e.g., 4 K) and the thermal clamp 401 creates an intermediate temperature domain (e.g., 25 K) between the first temperature domain and the second temperature domain. As illustrated in FIG. 4, the thermal clamp 401 may be made of two segments of the electrical conductor pair with a gap 416 in an insulator that insulates the sidewalls of the two segments of the electrical conductor pair. The conductors may be copper and the insulator can have the gap 416 in the insulator to thermally clamp the conductors to the intermediate temperature domain (T1) 406. The thermal clamp 401 can be designed to optimize the aspect ratios of two segments 408, 410 of the electrical conductor pair, instead of just one segment as illustrated in FIG. 2. A first aspect ratio (A21/L21) is the cross-sectional area of the first segment 408 over the length of the first segment 408. A second aspect ratio (A10/L10) is the cross-sectional area of the second segment 410 over the length of the second segment 410. In one embodiment, A21 is 5.0×10−9M2, L21 is 1.10×10−2M and A10 is 1.25×10−9M2, L10 is 8.4×10−4M. The total overhead power flowing into the intermediate temperature domain 406 is expressed in the following equation:

$$P_{21} = 2*I_0^2*\rho_0*\frac{L_{21}}{A_{21}} + 2*\lambda_0*\left[(T_2-T_1)*\frac{A_{21}}{L_{21}} - (T_1-T_0)*\frac{A_{10}}{L_{10}}\right]$$

The total overhead power flowing into the low-temperature domain 402 is expressed in the following equation:

$$P_{10}=2*I_0^2*\rho_0*L_{10}/A_{10}+2*\lambda_0*(T_1-T_0)*A_{10}/L_{10}$$

In this embodiment, these aspect ratios are dissimilar. In other embodiments, the aspect ratios may be similar or may have similar cross-sectional areas and dissimilar lengths, or vice versa. By selecting the appropriate aspect ratios of the two segments of electrical conductor pair (e.g., wire), the appropriate intermediate temperature domain 406 can be set to a desired intermediate temperature to operate as a thermal clamp 401 between the two temperature domains. The thermal clamp 401 is used to extract as much heat as possible at the intermediate temperature domain 406 so that the efficiency overhead to extract the heat at the second temperature domain (e.g., 402) is going to be smaller than the efficiency overhead to extract the heat at the second temperature domain without the thermal clamp 401. The sum of the power needed to extract the heat from the second temperature domain to the first temperature domain (e.g., 404) and the power needed to extract the heat from the intermediate temperature domain to the first temperature domain 404) is less than the power needed to extract heat from the second temperature domain (e.g., 402) when not using the thermal clamp 401 to the intermediate temperature domain (e.g., 406). These two aspect ratios ($A_{21}/L_{21}$) and ($A_{10}/L_{10}$) can be optimized to minimize total thermal power of the conductors.

Figure 5:
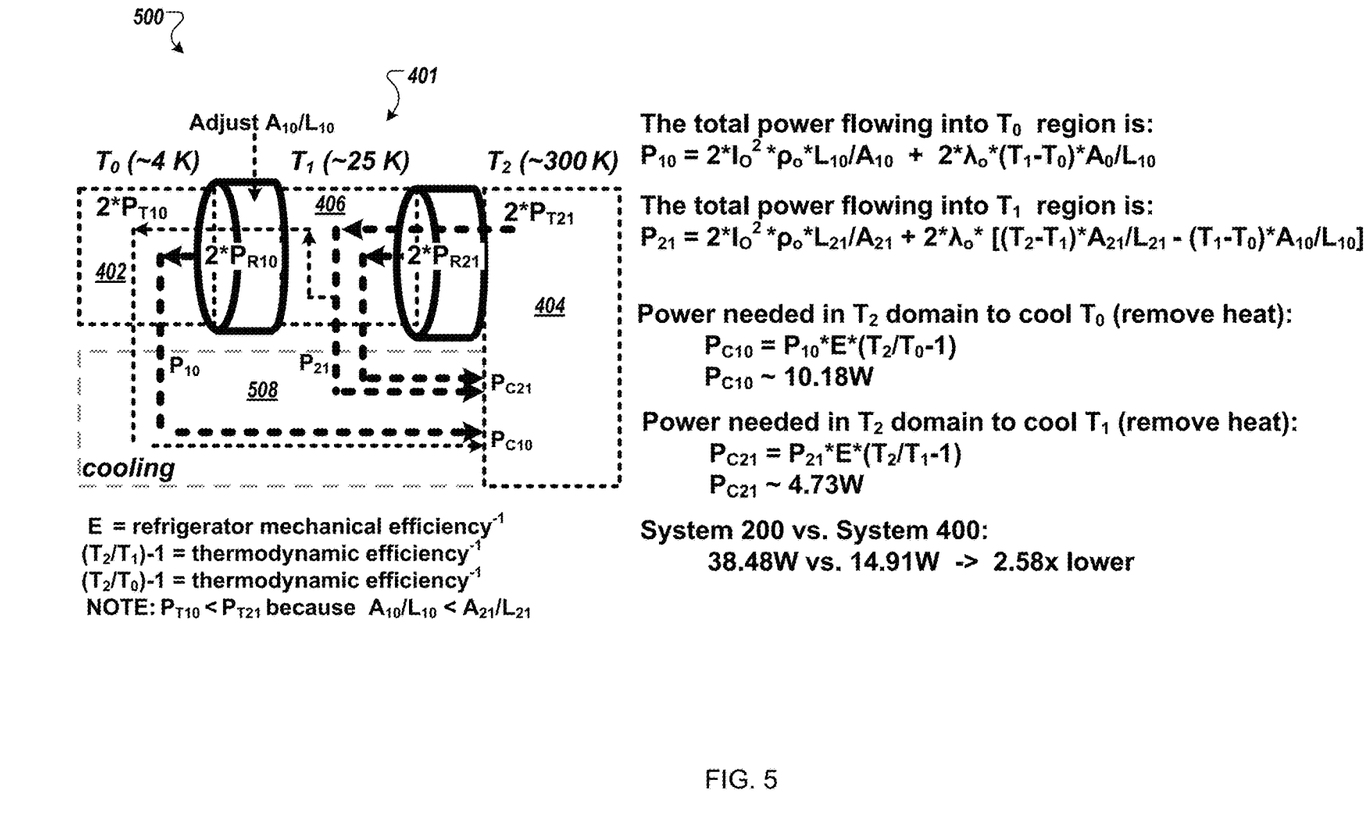
FIG. 5 is a block diagram of the cryogenic digital system with the thermal clamp and a cooling system according to one embodiment.

FIG. 5 is a block diagram of the cryogenic digital system 500 with the thermal clamp and a cooling system according to one embodiment. In this embodiment, a cooling system 508 can be used to pull heat from the low-temperature domain 402. The cooling subsystem 508 has an E factor that represents the mechanical efficiency to operate the cooling subsystem (e.g., 3) and two thermodynamic efficiencies noted below. The overhead (heat) flow, including both the electrical interconnect heat (due to the interconnect resistance) and interconnect thermal conduction, into the low-temperature domain 402 is expressed in the following equation;

$$P_{TOT}=P_{21}+P_{10}, \text{ where } P_{21}>P_{10}$$

In this implementation, the ambient temperature domain 404 is at 300 K and the low-temperature domain 402 is at 4 K, resulting in a temperature difference (ΔT) of 296 K. Assuming the following parameters, the cryogenic digital system 400 with the heat optimizations of the aspect ratios of segments of the electrical conductor pair, including a first length ($L_{21}$) of 1.0×10−2M, a first cross-sectional area $A_{21}$ is 5.0×10−9M², a second length $L_{10}$ is 8.4×10−4M with and a second cross-sectional area $A_{10}$ is 1.25×10−9M², copper resistivity ($\rho_0$) of 1.55×10−8 Ω-M, and copper thermal conductivity ($\lambda_0$) of 401 W/M-K, can supply a current ($I_0$) of 1 amp over the electrical conductor pair. The logic 412 in the low-temperature domain 402 uses 1 W of power. The overhead heat power equation for this electronic system is expressed as follows:

$$P_{OH}=P_{21}+P_{10}, \text{ where } P_{21}>P_{10}$$

The power needed in ambient domain 404 ($T_2$) to remove the overhead power from the low-temperature domain 402 ($T_2$) is expressed in the following equation:

$$P_{C10}=P_{10}*E*(T_2/T_0-1)=10.17 \text{ W}.$$

The power needed in ambient domain 404 ($T_2$) to cool the intermediate temperature domain 406 ($T_1$) is expressed in the following equation:

$$P_{C21}=P_{21}*E*(T_2/T_1-1)=4.02 \text{ W}.$$

With the values for the parameters above, the total power needed to remove the thermal conductive and electrical resistive overhead power in the cryogenic digital system 400 is 14.19 W, as compared to 140 W for the cryogenic digital system 100 and 38 W for the cryogenic digital system 200 (2.7× lower). It should be noted that load power and overhead power are used herein, but the overhead power can be analyzed separately from the load power in some cases. When referring to "total" power and cryogenic efficiency, as in $P_{C10}$ above, the sum of the load an interconnect power should be summed. It should also be noted that the heat optimization described herein are mainly directed to optimizing the overhead power.

The cryogenic digital system 400 includes one thermal clamp 401 at one intermediate temperature domain 406. In other embodiments, additional thermal clamps may be used, as illustrated in various embodiments of FIGS. 6A-6B.

Figure 6A:
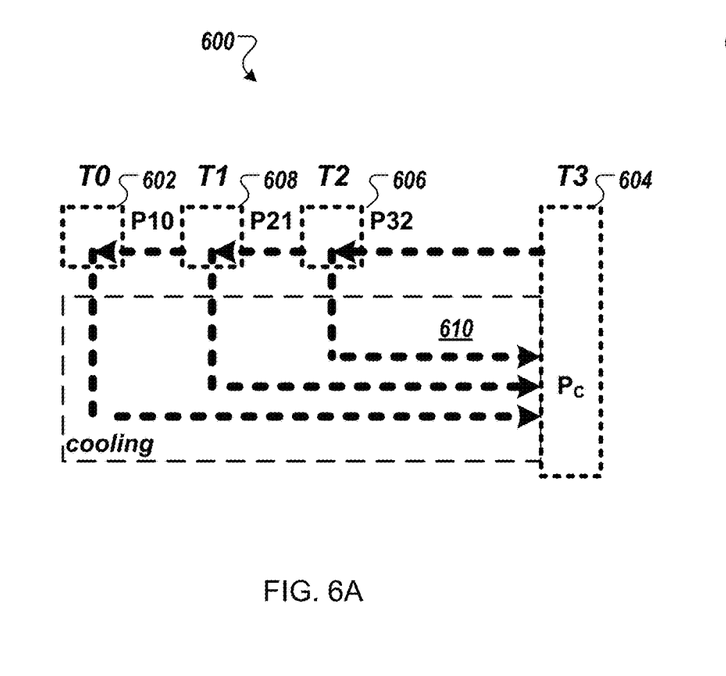
FIG. 6A is a block diagram of a cryogenic digital system with two thermal clamps according to one embodiment.

FIG. 6A is a block diagram of a cryogenic digital system 600 with two thermal clamps according to one embodiment. The cryogenic digital system 600 includes a first temperature domain 604, a second temperature domain 602 and two intermediate temperature domains 606, 608. Segments of the electrical conductive pair are thermally coupled to the two intermediate temperature domains 606, 608, similar to the thermal clamp 401 described above with respect to FIG. 4. A cooling subsystem 610 can be used to remove heat from the second temperature domain 602, intermediate temperature domain 606, intermediate temperature domain 608, or any combination thereof In another embodiment, a first cooling subsystem can remove heat from the second temperature domain 602, a second cooling subsystem can remove heat from the intermediate temperature domain 606, and a third cooling subsystem can remove heat from the intermediate temperature domain 608. The aspect ratios of these thermal clamps can be selected for the desired temperature domains at each stage.

Figure 6B:
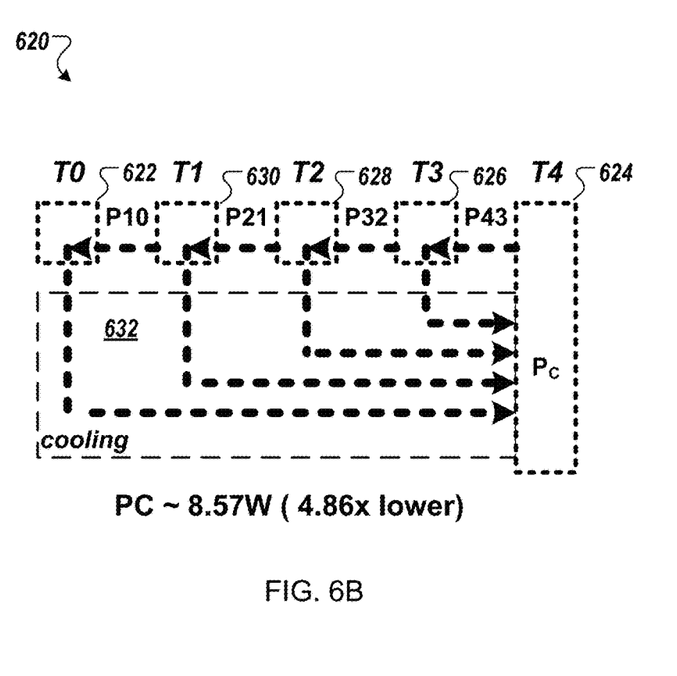
FIG. 6B is a block diagram of a cryogenic digital system with three thermal clamps according to one embodiment.

FIG. 6B is a block diagram of a cryogenic digital system 620 with three thermal clamps according to one embodiment. The cryogenic digital system 620 includes a first temperature domain 624, a second temperature domain 622 and three intermediate temperature domains 626, 628, and 630. An electrical conductive pair is coupled between a first component located in the first temperature domain 624 and a second component located in the second temperature domain 622. Segments of the electrical conductive pair are thermally coupled to the three intermediate temperature domains 626, 628, 630, similar to the thermal clamp 401 described above with respect to FIG. 4. A cooling subsystem 632 can be used to remove heat from the second temperature domain 622, intermediate temperature domain 626, intermediate temperature domain 628, intermediate temperature domain 630, or any combination thereof. In another embodiment, individual cooling subsystems can remove heat from the respective temperature domains. The aspect ratios of these thermal clamps can be selected for the desired temperature domains at each stage.

Continuing with the exemplary parameters described above, the total power needed to remove the overhead (thermal conduction and electrical interconnect) heat in the cryogenic digital system 620 is 8.57 W (4.86× lower than power needed to extract heat from cryogenic digital system 200 of FIG. 2).

Figure 7:
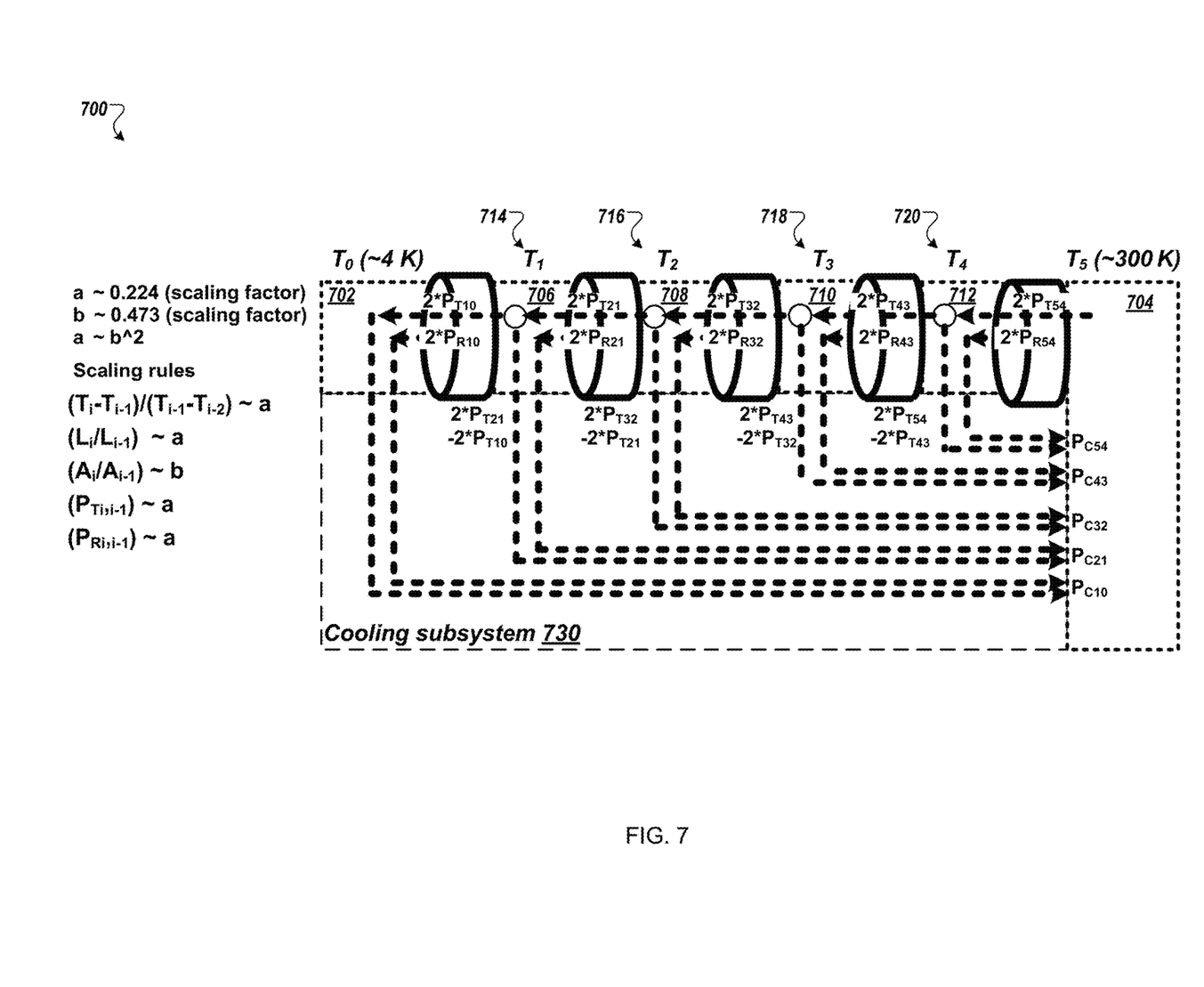
FIG. 7 is a block diagram of a cryogenic digital system with multiple thermal clamps according to one embodiment.

FIG. 7 is a block diagram of a cryogenic digital system 700 with multiple thermal clamps according to one embodiment. The cryogenic digital system 700 includes a first temperature domain 704 ($T_5$), a second temperature domain 702 ($T_0$), a first intermediate temperature domain 706 ($T_1$), a second intermediate temperature domain 708 ($T_2$), a third intermediate temperature domain 710 ($T_3$), and a fourth intermediate temperature domain 712 ($T_4$). The electrical conductor pair includes four thermal clamps 714-720 that thermally clamp to the respective intermediate temperature domains 706-712.

In one embodiment, the aspect ratios can be defined according to the following scaling rules:

$(T_i - T_{i-1})/(T_{i-1} - T_{i-2}) \sim a$;

$(L_i/L_{i-1}) \sim a$;

$(A_i/A_{i-1}) \sim b$;

$(P_{Ti,i-1}) \sim a$; and $(P_{Ri,i-1}) \sim a$, where a~0.224 (scaling factor), b~0.473 (scaling factor), and a~$b^2$.

A cooling subsystem 730 can be used to remove heat from any one or more of the first temperature domain 702 and intermediate temperature domains 706-712 as described herein.

The embodiments described above are directed to thermal clamp made of segments of the electrical conductor pair and gaps in the insulator between segments in the electrical conductor pair. In other embodiments, the thermal clamp may be made using other configurations, such as cooling the sidewalls of conductors with cooling fluid, such as illustrated and described with respect to FIG. 8.

Figure 8:
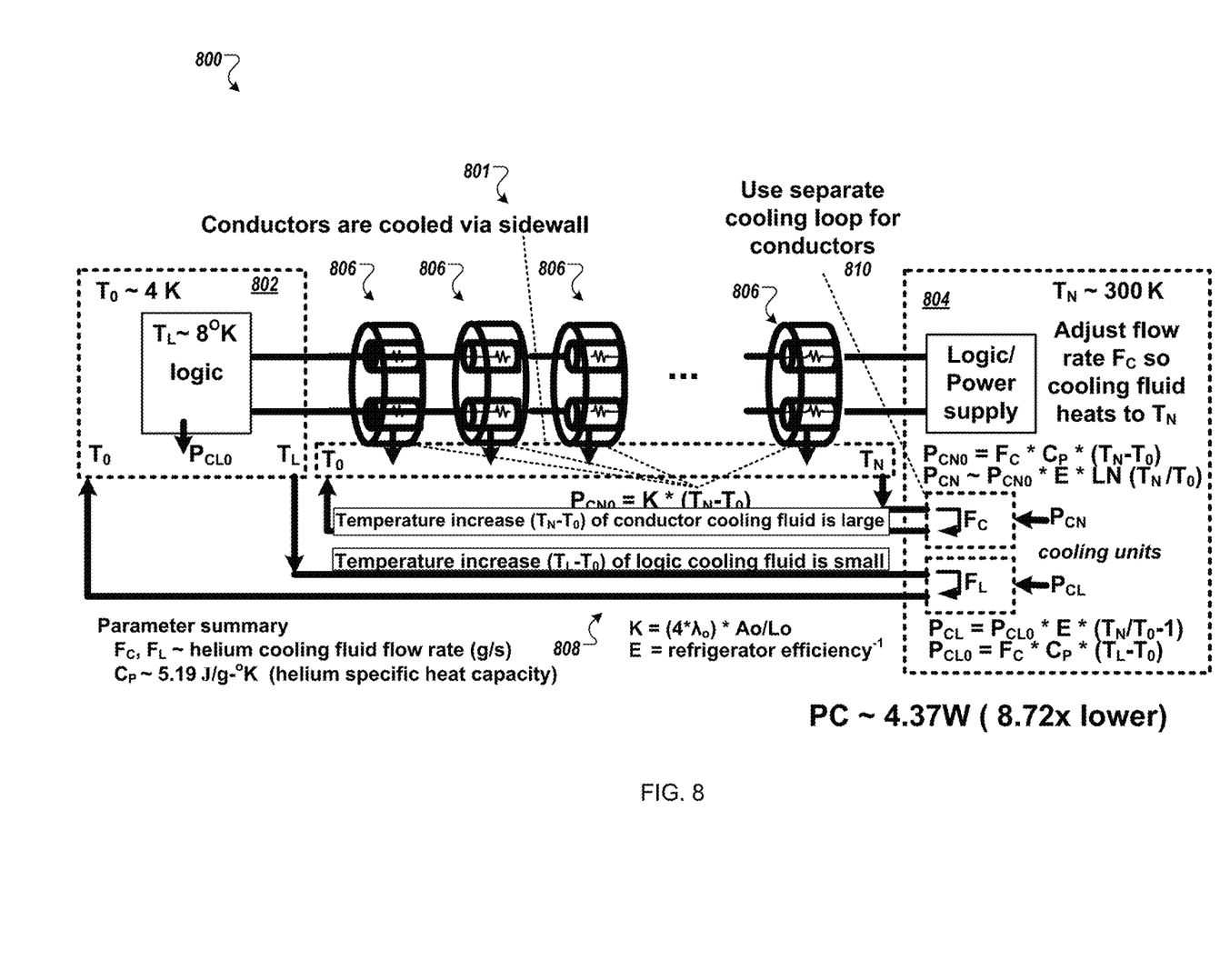
FIG. 8 is a block diagram of a cryogenic digital system with a continuous thermal clamp according to one embodiment.

FIG. 8 is a block diagram of a cryogenic digital system 800 with a continuous thermal clamp 801 according to one embodiment. The cryogenic digital system 800 includes a first temperature domain 804 ($T_N$) and a second temperature domain 802 ($T_0$). An electrical conductor pair includes multiple segments 806 whose sidewalls are insulated. A cooling system uses a first cooling fluid 808 to remove the heat from the second temperature domain 802 ($T_0$) and uses a second cooling fluid 810 to remove the heat from the sidewalls of the segments 806. For example, a first cooling subsystem can remove heat from the second temperature domain 802 ($T_0$) to the first temperature domain 804 ($T_N$) using the first cooling fluid, and a second cooling subsystem to remove heat from sidewalls of segments 806 using the second cooling fluid 810. The second temperature domain 802 ($T_0$) contains an entry port and an exit port for the first cooling fluid 808. The second temperature domain 802 ($T_0$) is sealed to prevent fluid loss at the point where the electrical conductor pair are connected. The continuous intermediate temperature regions, as defined by the segments 806 of the electrical conductor pair, contain an entry port and an exit port for the second cooling fluid 810 and the segments 806 of the electrical conductor pair 806 include a channel for the second cooling fluid 810. In some cases the intermediate temperature domain can be a chamber with a first side (e.g., entry port) at a first temperature (entry temperature) and a second side (e.g., exit port) at a second temperature and the second cooling fluid flows through the channel of the electrical conductor pair to cool the sidewalls of the conductors of the segments 806. For example, the second cooling subsystem is adjusted so the second cooling fluid 810 entering at a first side of a chamber is at a first temperature (entry temperature) and the second cooling fluid 810 exiting at a second side of the chamber is at a second temperature (exit temperature). The entry/exit temperatures are great than a temperature of the first cooling fluid 808.

In one embodiment, the cooling system adjusts the flow of the second cooling fluid 810 so the second cooling fluid 810 heats to the temperature $T_N$ of the second temperature domain 804. The temperature increase ($T_N-T_0$) of conductor cooling fluid is large and the temperature increase ($T_i-T_0$) of logic cooling fluid is small in comparison. The power needed to remove the heat from the sidewalls is expressed in the following equation:

$P_{CN0} = K^*(T_N-T_0)$

Using the same parameters described herein, the power needed to remove the heat is 4.37 W (8.72× lower). In another embodiment, a dedicated, adjustable cooling loop for the conductors can be used, as illustrated in a graph of FIG. 9.

Figure 9:
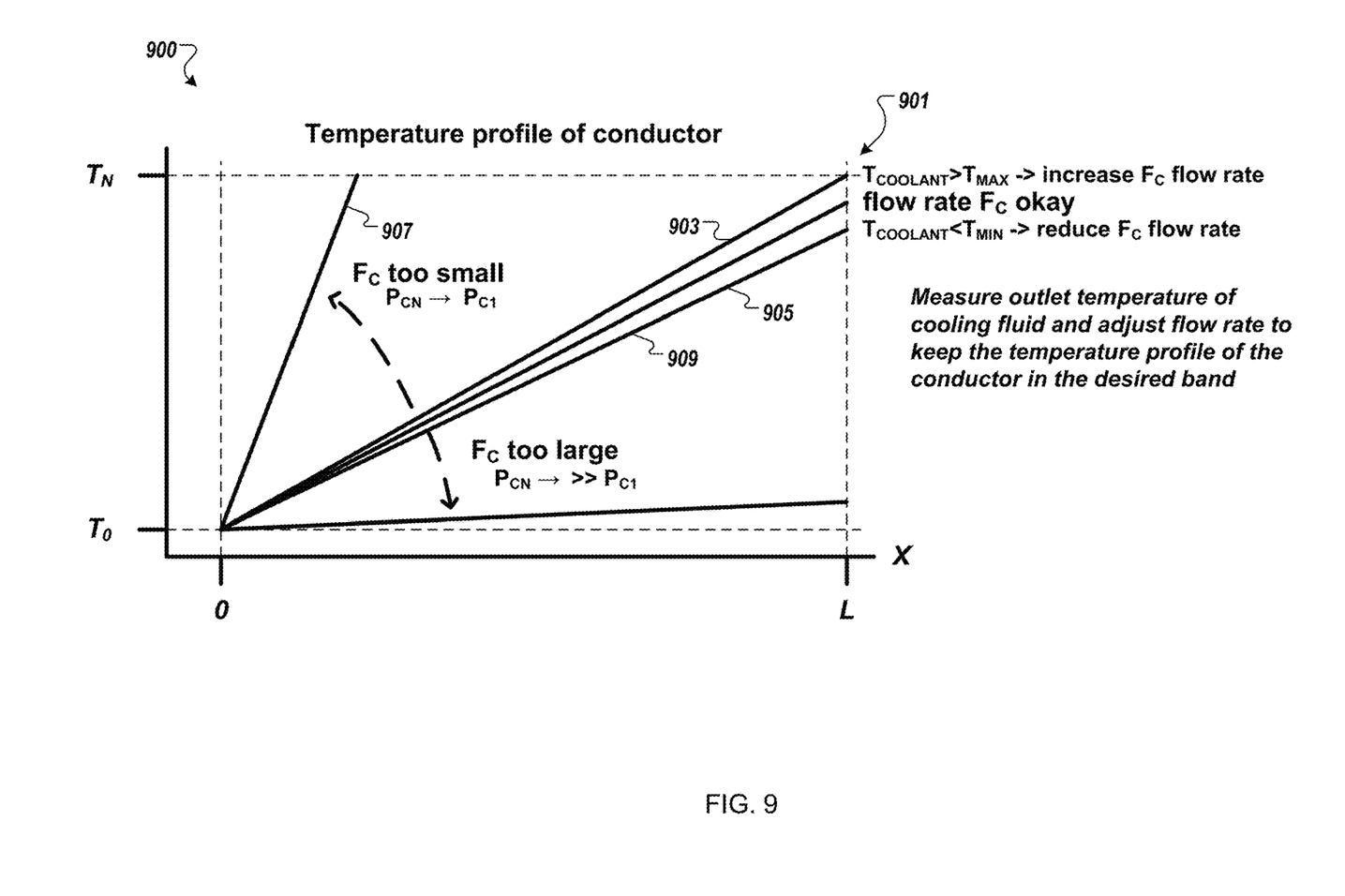
FIG. 9 is a graph 900 of an adjustable cooling loop for the conductors in the cryogenic digital system of FIG. 8 with the continuous thermal clamp according to one embodiment.

FIG. 9 is a graph 900 of an adjustable cooling loop for the conductors in the cryogenic digital system 800 of FIG. 8 with the continuous thermal clamp according to one embodiment. As illustrated, the outlet temperature can be measured by the cooling subsystem and adjust the flow rate of the second cooling fluid 810 to keep the temperature profile of the conductor in a desired band 901. The desired band 901 can be defined as a maximum temperature $T_{MAX}$ 903 and a minimum temperature $T_{MIN}$ 905. When the outlet temperature is measured as being greater than $T_{MAX}$ 903, such as line 907, the cooling subsystem can increase the flow rate ($F_C$) to keep the temperature profile in the desired band 901. When the outlet temperature is measured as being less than $T_{MIN}$ 905, such as line 909, the cooling subsystem can reduce the flow rate ($F_C$) to keep the temperature profile in the desired band 901.

In some embodiments, the electrical conductor pair includes an aspect ratio that is set to a specified value of a cross-sectional area of a conductor of the electrical conductor pair divided by a length of the conductor as described above. In other embodiments, the electrical conductor pair includes an conductor with a tapered shape to adjust an aspect ratio of a cross-sectional area of a conductor of the electrical conductor pair divided by a length of the conductor over the length of the conductor as a function of a temperature difference between the first temperature domain and the second temperature domain, as illustrated in FIG. 10.

Figure 10:
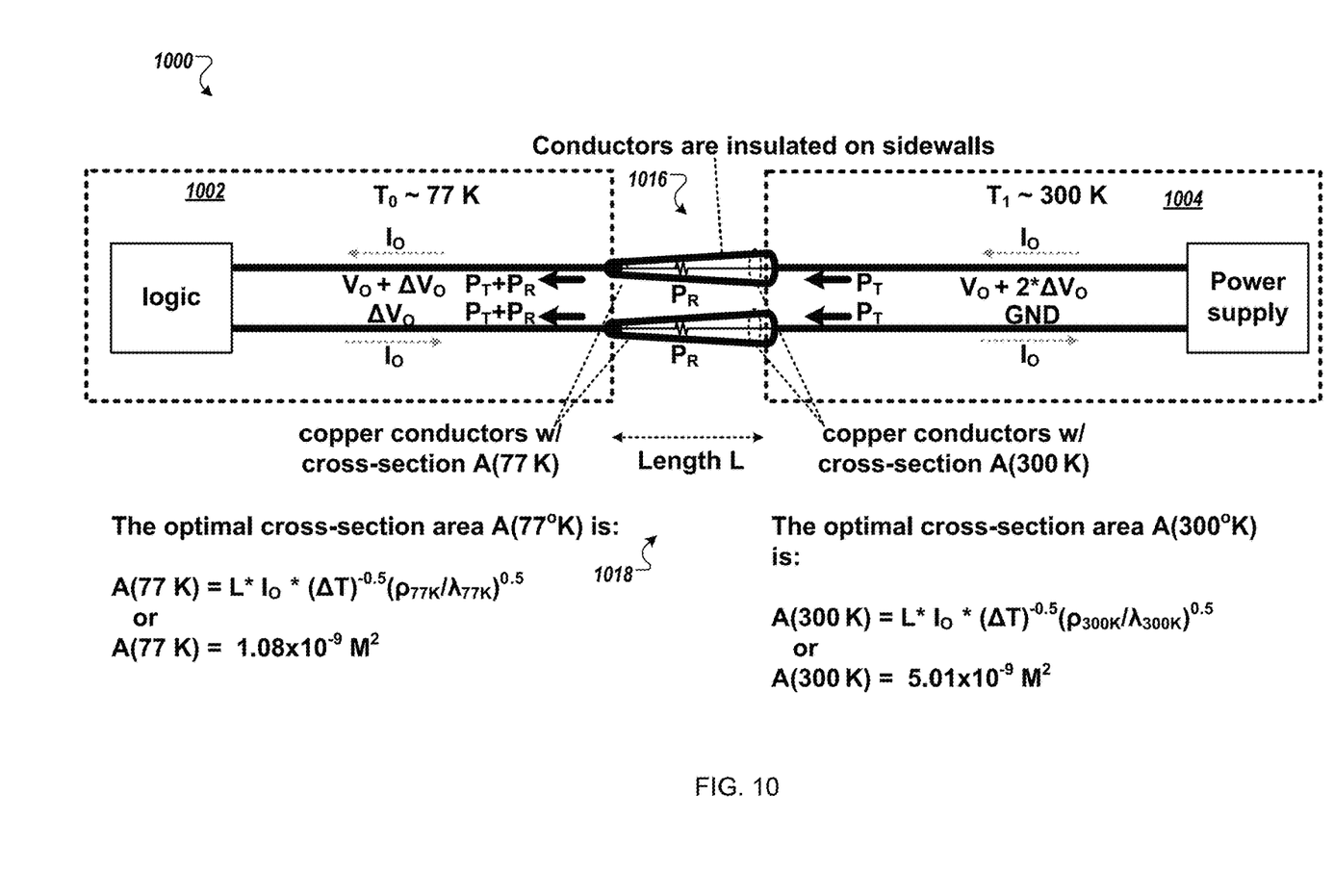
FIG. 10 is a block diagram of a cryogenic digital system with tapered conductors according to one embodiment.

FIG. 10 is a block diagram of a cryogenic digital system 1000 with tapered conductors 1006 according to one embodiment. The cryogenic digital system 1000 includes a first temperature domain 1004 ($T_1$) and a second temperature domain 1002 ($T_0$). An electrical conductor pair includes tapered conductors that are insulated on sidewalls. Each conductor has a first aspect ratio that is optimal between a first temperature and a second temperature using the tapered shape of the conductor. For example, the cross-sectional area A(300 K) for the first temperature domain 1004 is expressed as follows:

$$A(300 \text{ K}) = L * I_0 * (\Delta T)^{-0.5} * \left(\frac{\rho_{300\ K}}{\lambda_{300\ K}}\right)^{0.5}$$

For the various parameters, the cross-sectional area for the second temperature domain 1002 is $5.01 \times 10^{-9}$ M$^2$. The cross-sectional area A(77 K) for the second temperature domain 1002 is expressed as follows:

$$A(77\ K) = L * I_0 * (\Delta T)^{-0.5} * \left(\frac{\rho_{77\ K}}{\lambda_{77\ K}}\right)^{0.5}$$

For the various parameters, the cross-sectional area for the second temperature domain 1002 is $1.08 \times 10^{-9}$ M$^2$. Alternatively, other tapered shapes may be used to achieve other aspect ratios for different temperature domains. The tapered conductors can also be used in connection with other types of thermal clamps described herein. For example, multiple intermediate temperature ranges may be used and the segments between the adjacent temperature ranges may include segments of the electrical conductor pair with tapered shapes.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form.

Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An electronic system comprising:
    a first component in a first temperature domain;
    a second component in a second temperature domain, wherein the second temperature domain is lower in temperature than the first temperature domain;
    an electrical conductor pair coupled between the first component and the second component, wherein the electrical conductor pair is operable to carry current with a voltage difference between the first component and the second component; and
    a thermal clamp comprising:
    a first insulator portion of an insulator that insulates sidewalls of a first segment of the electrical conductor pair, the first segment being located between the first temperature domain and an intermediate temperature domain;
    a second insulator portion of the insulator that insulates sidewalls of a second segment of the electrical conductor pair, the second segment being located between the intermediate temperature domain and the second temperature domain; and
    a gap in the insulator, the gap being located between the first and second segments in the electrical conductor pair, and wherein an intermediate segment of the electrical conductor pair in the gap in the insulator is thermally coupled to the intermediate temperature domain that is lower in temperature than the first temperature domain and greater in temperature than the second temperature domain.

2. The electronic system of claim 1, wherein the intermediate temperature domain is at least one of a temperature-regulated domain or a temperature-controlled domain.

3. The electronic system of claim 1, wherein the first component is a power supply, and wherein the first temperature domain is an ambient temperature and the second temperature domain is a cryogenic temperature.

4. The electronic system of claim 1, wherein the first temperature domain is an ambient temperature and the second temperature domain is a first cryogenic temperature, and wherein the intermediate temperature domain is a second cryogenic temperature that is greater than the first cryogenic temperature.

5. The electronic system of claim 1, further comprising a cooling subsystem to remove heat from the second temperature domain to the first temperature domain.

6. The electronic system of claim 1, further comprising:
    a first cooling subsystem to remove heat from the second temperature domain to the first temperature domain; and
    a second cooling subsystem to remove heat from the intermediate temperature domain to the first temperature domain.

7. The electronic system of claim 1, wherein a second intermediate segment of the electrical conductor pair is thermally coupled to a second intermediate temperature domain.

8. The electronic system of claim 1, further comprising:
    a first cooling subsystem to remove heat from the second temperature domain to the first temperature domain using a first cooling fluid; and
    a second cooling subsystem to remove heat from sidewalls of segments of electrical conductors of the electrical conductor pair, wherein the second cooling subsystem is adjusted so a second cooling fluid entering at a first side of a chamber is at a first temperature and the second cooling fluid exiting at a second side of the chamber is at a second temperature, and wherein at least one of the first temperature or the second temperature of the second cooling fluid is greater than a third temperature of the first cooling fluid.

9. The electronic system of claim 1, wherein the electrical conductor pair comprises an aspect ratio that is set to a specified value of a cross-sectional area of a conductor of the electrical conductor pair divided by a length of the conductor.

10. The electronic system of claim 1, wherein the electrical conductor pair comprises a conductor with a tapered shape to adjust an aspect ratio of a cross-sectional area of the conductor of the electrical conductor pair divided by a length of the conductor over the length of the conductor as a function of a temperature difference between the first temperature domain and the second temperature domain.

11. A cryogenic digital system comprising:
    a first temperature domain;
    a second temperature domain;
    an intermediate temperature domain, wherein the intermediate temperature domain is lower in temperature than the first temperature domain and higher in temperature than the second temperature domain;
    an electrical conductor pair coupled between a power supply in the first temperature domain and logic in the second temperature domain, wherein the electrical conductor pair contributes heat by thermal conduction and electrical heating when current is supplied by the power supply to the logic; and a thermal clamp that is thermally coupled to the intermediate temperature domain to reduce an amount of power needed at the first temperature domain to remove the heat from the second temperature domain, wherein the thermal clamp comprises:
  a first insulator portion of an insulator that insulates a first segment of the electrical conductor pair that is between the first temperature domain and the intermediate temperature domain;
  a second insulator portion of the insulator that insulates a second segment of the electrical conductor pair that is between the intermediate temperature domain and the second temperature domain;
  a third segment of the electrical conductor pair in the intermediate temperature domain; and
  a gap in the insulator corresponding to a third segment of the electrical conductor pair in the intermediate temperature domain, the gap being between the first insulator portion and the second insulator portion in the intermediate temperature domain.

12. The cryogenic digital system of claim 11, wherein the intermediate temperature domain is at least one of a temperature-regulated domain or a temperature-controlled domain.

13. The cryogenic digital system of claim 11, further comprising a first cooling subsystem, wherein the thermal clamp is a continuous thermal clamp comprising a plurality of segments of the electrical conductor pair, wherein the plurality of segments is separated by gaps in the insulator and sidewalls of the plurality of segments are insulated, wherein the first cooling subsystem is operable to remove heat from plurality of segments.

14. The cryogenic digital system of claim 11, wherein the electrical conductor pair comprises conductors with tapered shapes.

15. A cryogenic digital system comprising:
  a first temperature domain;
  a second temperature domain;
  an intermediate temperature domain, wherein the intermediate temperature domain is lower in temperature than the first temperature domain and higher in temperature than the second temperature domain;
  an electrical conductor pair coupled between a power supply in the first temperature domain and logic in the second temperature domain, wherein the electrical conductor pair contributes heat by thermal conduction and electrical heating when current is supplied by the power supply to the logic, wherein the electrical conductor pair comprises a thermal clamp that is thermally coupled to the intermediate temperature domain to reduce an amount of power needed at the first temperature domain to remove the heat from the second temperature domain, wherein the thermal clamp comprises a gap in an insulator of the electrical conductor pair, the gap being between two segments in the electrical conductor pair, wherein the gap is thermally coupled to the intermediate temperature domain; and
  a second intermediate temperature domain, wherein the thermal clamp further comprises a second gap in the insulator of the electrical conductor pair, the second gap being between two segments in the electrical conductor pair, wherein the second gap is thermally coupled to the second intermediate temperature domain, and wherein the second intermediate temperature domain is lower in temperature than the first temperature domain, higher in temperature than the second temperature domain, and higher in temperature than the intermediate temperature domain.

16. The cryogenic digital system of claim 15, further comprising a second cooling subsystem, wherein the second cooling subsystem is operable to remove heat from the second temperature domain.

17. An electronic system comprising:
  a power supply located in an ambient temperature domain;
  logic located in a cryogenic temperature domain, the cryogenic temperature domain being less than the ambient temperature domain; and
  a pair of conductors operable to carry current with a voltage difference between the power supply and the logic, wherein the pair of conductors comprises a first portion thermally coupled to a temperature-regulated or temperature-controlled intermediate temperature domain, wherein a first end of the first portion being coupled to a second portion of the pair of conductors and a second end of the first portion being coupled to a third portion of the pair of conductors, the second portion being insulated by a first insulating portion that is between the ambient temperature domain and the intermediate temperature domain and the third portion being insulated by a second insulating portion that is between the intermediate temperature domain and the cryogenic temperature domain, and the first portion corresponding to a gap between the first insulating portion and the second insulating portion in the intermediate temperature domain, wherein the intermediate temperature domain is less than the ambient temperature domain and greater than the cryogenic temperature domain.

18. The electronic system of claim 17, wherein the pair of conductors comprises a fourth portion thermally coupled to a second temperature-regulated or temperature-controlled intermediate temperature domain.

* * * * *

UNITED STATES PATENT AND TRADEMARK OFFICE
CERTIFICATE OF CORRECTION

PATENT NO. : 10,509,448 B2
APPLICATION NO. : 15/243596
DATED : December 17, 2019
INVENTOR(S) : Frederick A. Ware et al.

Page 1 of 1

It is certified that error appears in the above-identified patent and that said Letters Patent is hereby corrected as shown below:

On the Title Page

Item (54) and in the Specification, Column 1, Line 1, delete "CYROGENIC" and insert
-- CRYOGENIC --

Signed and Sealed this
Twenty-eighth Day of January, 2020

Andrei Iancu
*Director of the United States Patent and Trademark Office*